United States Patent
Arifeen et al.

(10) Patent No.: US 11,587,918 B2
(45) Date of Patent: Feb. 21, 2023

(54) SEMICONDUCTOR DEVICES, SEMICONDUCTOR DEVICE PACKAGES, ELECTRONIC SYSTEMS INCLUDING SAME, AND RELATED METHODS

(71) Applicant: Micron Technology, Inc., Boise, ID (US)

(72) Inventors: Shams U. Arifeen, Boise, ID (US); Xiaopeng Qu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/717,827

(22) Filed: Dec. 17, 2019

(65) Prior Publication Data

US 2021/0183843 A1 Jun. 17, 2021

(51) Int. Cl.
*H01L 25/18* (2006.01)
*H01L 23/498* (2006.01)
(Continued)

(52) U.S. Cl.
CPC ........ *H01L 25/18* (2013.01); *H01L 23/49816* (2013.01); *H01L 24/16* (2013.01); *H01L 24/48* (2013.01); *H01L 25/50* (2013.01); *H01L 2224/16225* (2013.01); *H01L 2224/48145* (2013.01); *H01L 2224/48225* (2013.01)

(58) Field of Classification Search
CPC ... H01L 23/49816; H01L 25/50; H01L 25/18; H01L 2224/16225; H01L 24/48; H01L 2224/48145; H01L 24/16; H01L 2224/48227; H01L 2924/1431; H01L 24/05; H01L 2224/48225; H01L 25/0657

See application file for complete search history.

(56) References Cited

U.S. PATENT DOCUMENTS 6,104,095 A  8/2000 Shin et al.
6,507,107 B2  1/2003 Vaiyapuri
(Continued)

FOREIGN PATENT DOCUMENTS

JP  2006-019433 A  1/2006
KR  10-2012-0089962 A  8/2012
(Continued)

OTHER PUBLICATIONS

Taiwanese First Office Action for Application No. 109142788, dated Oct. 12, 2021, 19 pages.

(Continued)

*Primary Examiner* — Jasmine J Clark
(74) *Attorney, Agent, or Firm* — TraskBritt (57) ABSTRACT

Semiconductor devices and semiconductor device packages may include at least one first semiconductor die supported on a first side of a substrate. The at least one first semiconductor die may include a first active surface. A second semiconductor die may be supported on a second, opposite side of the substrate. The second semiconductor die may include a second active surface located on a side of the second semiconductor die facing the substrate. The second semiconductor die may be configured to have higher median power consumption than the at least one first semiconductor die during operation. An electronic system incorporating a semiconductor device package is disclosed, as are related methods.

16 Claims, 8 Drawing Sheets

(51) Int. Cl.
    *H01L 23/00*     (2006.01)
    *H01L 25/00*     (2006.01)

(56) References Cited

U.S. PATENT DOCUMENTS

| | | | |
|---|---|---|---|
| 7,872,871 B2 | 1/2011 | Hiew et al. | |
| 8,298,940 B2* | 10/2012 | Ishino | H01L 25/0657 438/667 |
| 9,515,052 B1* | 12/2016 | Lee | H01L 23/13 |
| 2003/0183914 A1 | 10/2003 | Wallace | |
| 2004/0241908 A1 | 12/2004 | Choi | |
| 2007/0252263 A1 | 11/2007 | Jow | |
| 2008/0265434 A1* | 10/2008 | Kurita | H01L 23/5389 257/777 |
| 2012/0248439 A1* | 10/2012 | Lee | H01L 23/49838 257/48 |
| 2020/0411496 A1* | 12/2020 | Zhang | H01L 25/50 |

FOREIGN PATENT DOCUMENTS

| | | |
|---|---|---|
| KR | 10-2017-0001238 A | 1/2017 |
| KR | 10-2019-0050777 A | 5/2019 |
| TW | 200913208 A | 3/2009 |

OTHER PUBLICATIONS

Korean First Office Action for Application No. 10-2020-0174326, dated Apr. 15, 2022, 11 pages.
Author: Jeong Jin-Wook, Title: A USB Memory Package; Country Korea Dec. 31, 2010; Application No. KR20100140263A, pp. 1-7. (Year: 2010).
Korean Second Notice of Reasons for Rejection for Korean Application No. 10-2020-0174326, dated Oct. 21, 2022, 14 pages with English translation.

\* cited by examiner

SEMICONDUCTOR DEVICES, SEMICONDUCTOR DEVICE PACKAGES, ELECTRONIC SYSTEMS INCLUDING SAME, AND RELATED METHODS

FIELD

This disclosure relates generally to semiconductor devices, semiconductor device packages, electronic systems including same, and related methods. More specifically, disclosed embodiments relate to semiconductor devices and semiconductor device packages that may better manage heat generated by semiconductor dice, may reduce device and/or package size and, particularly, device and/or package height, and may improve device and/or package performance.

BACKGROUND

Semiconductor devices and semiconductor device packages may include some semiconductor dice configured to generate more heat than other semiconductor dice. For example, semiconductor dice configured as processors, microprocessors, controllers, microcontrollers, logic controllers may generally generate more heat than semiconductor dice configured as memory devices.

Semiconductor devices and semiconductor device packages evolve to employ ever-smaller form factors, which trend results in ever-smaller available real estate (i.e., surface area) to accommodate assemblies including relatively high power (i.e., high power density) semiconductor dice, such as, for example, semiconductor devices or semiconductor device packages including a controller die and multiple memory die. In current semiconductor device and semiconductor device package configurations including controller and memory die, the high heat generation by the controller die undesirably increases the temperature of the memory dice, which may lead to performance degradation and ultimately failure.

Figure 5:
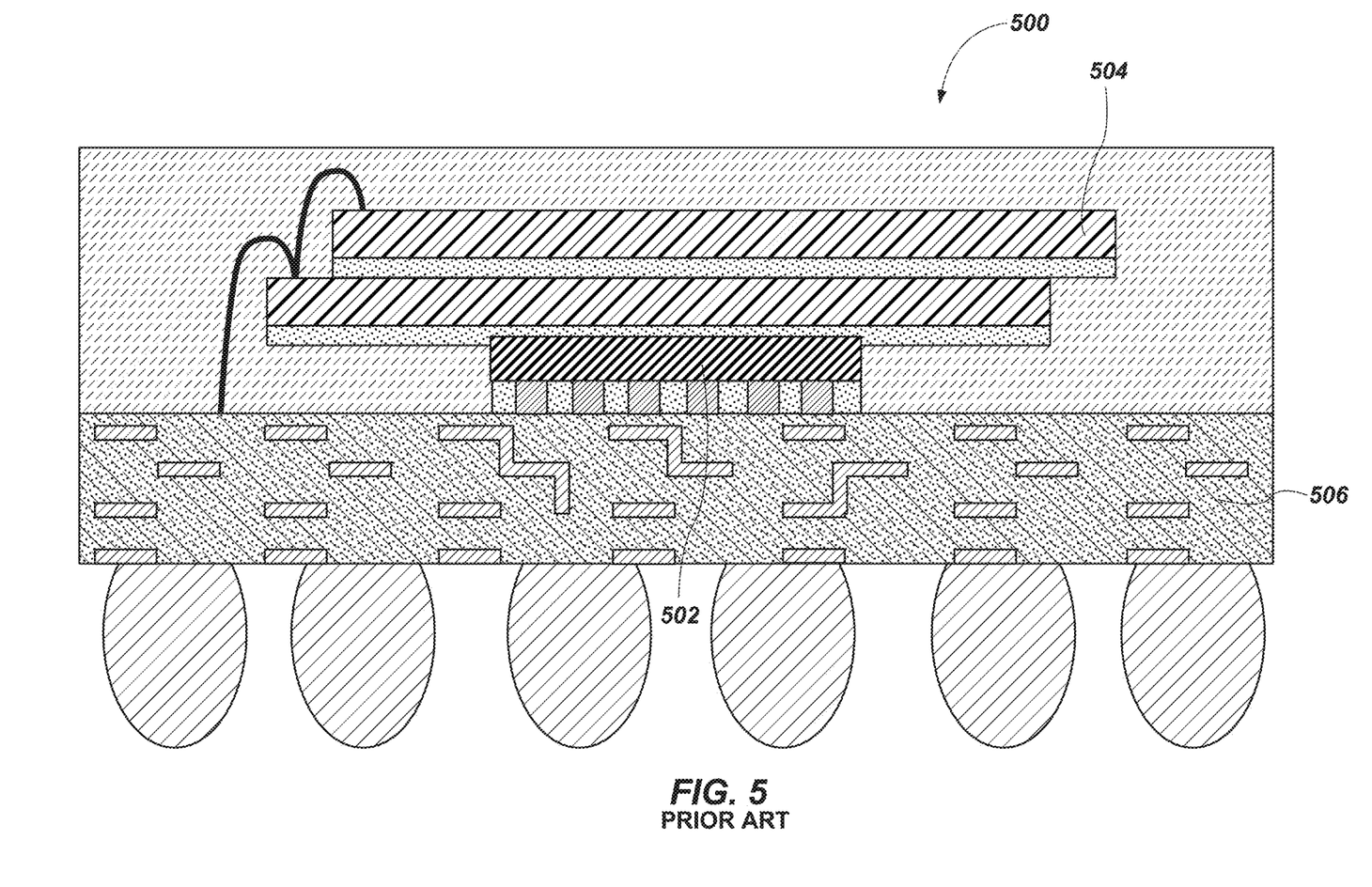
FIG. 5 is a cross-sectional schematic view of a first conventional semiconductor device package including a controller die under a memory die stack on a substrate.
Figure 6:
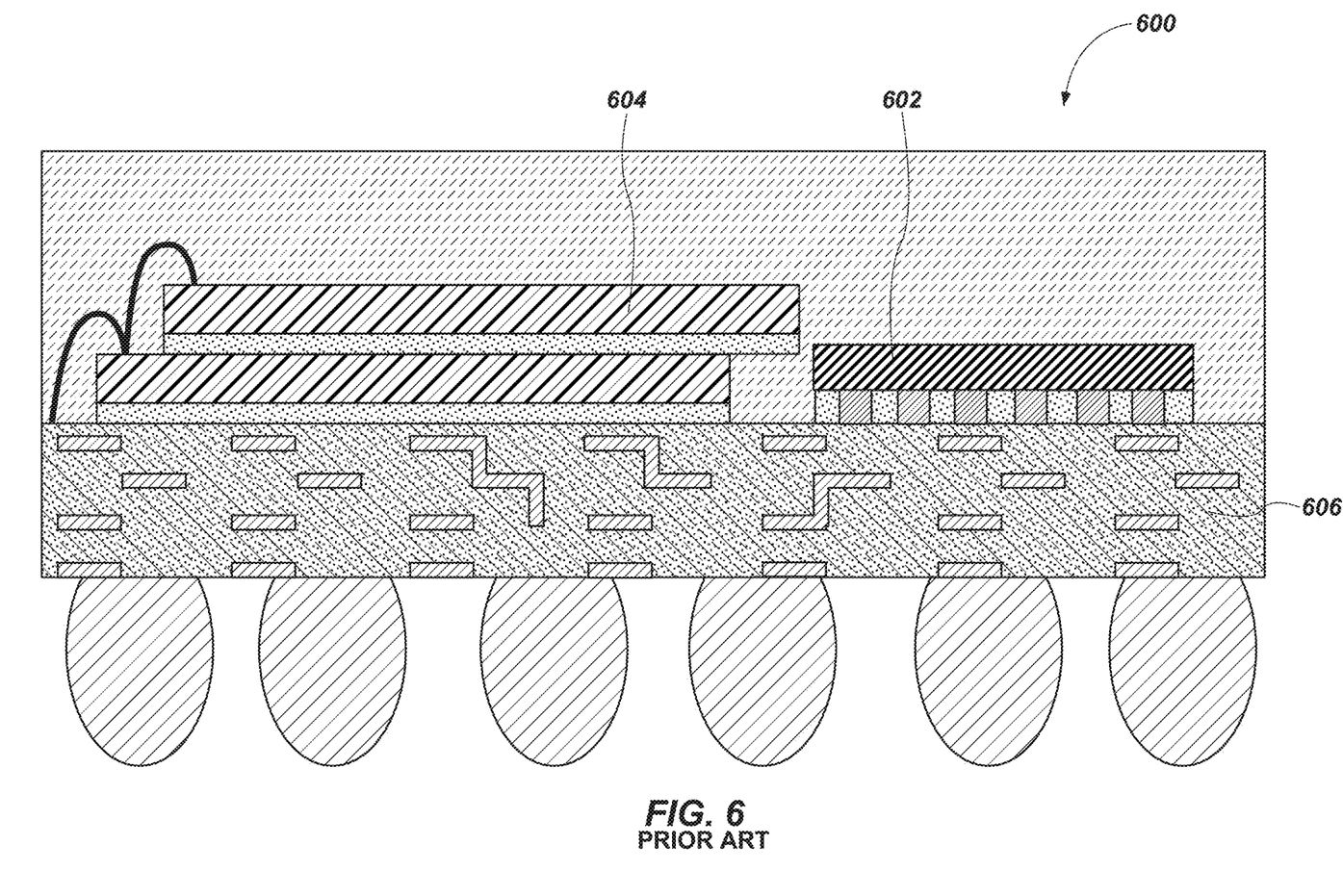
FIG. 6 is a cross-sectional schematic view of a second conventional semiconductor device package design including a controller die adjacent a memory die stack on a substrate.

Two conventional semiconductor package designs exhibiting this problem are depicted in FIGS. 5 through 8, respectively. FIG. 5 is a cross-sectional schematic view of a first conventional semiconductor device package 500 including a controller die 502 under a memory die stack 504 on a substrate 506. In such a configuration, the controller die 502 may be interposed between the substrate 506 and the memory die stack 504. FIG. 6 is a cross-sectional schematic view of a second conventional semiconductor device package 600 including a controller die 602 adjacent a memory die stack 604 on a substrate 606. In such a configuration, the controller die 602 may be located laterally adjacent to the memory die stack 604 on a major surface of the substrate 606.

Figure 7:
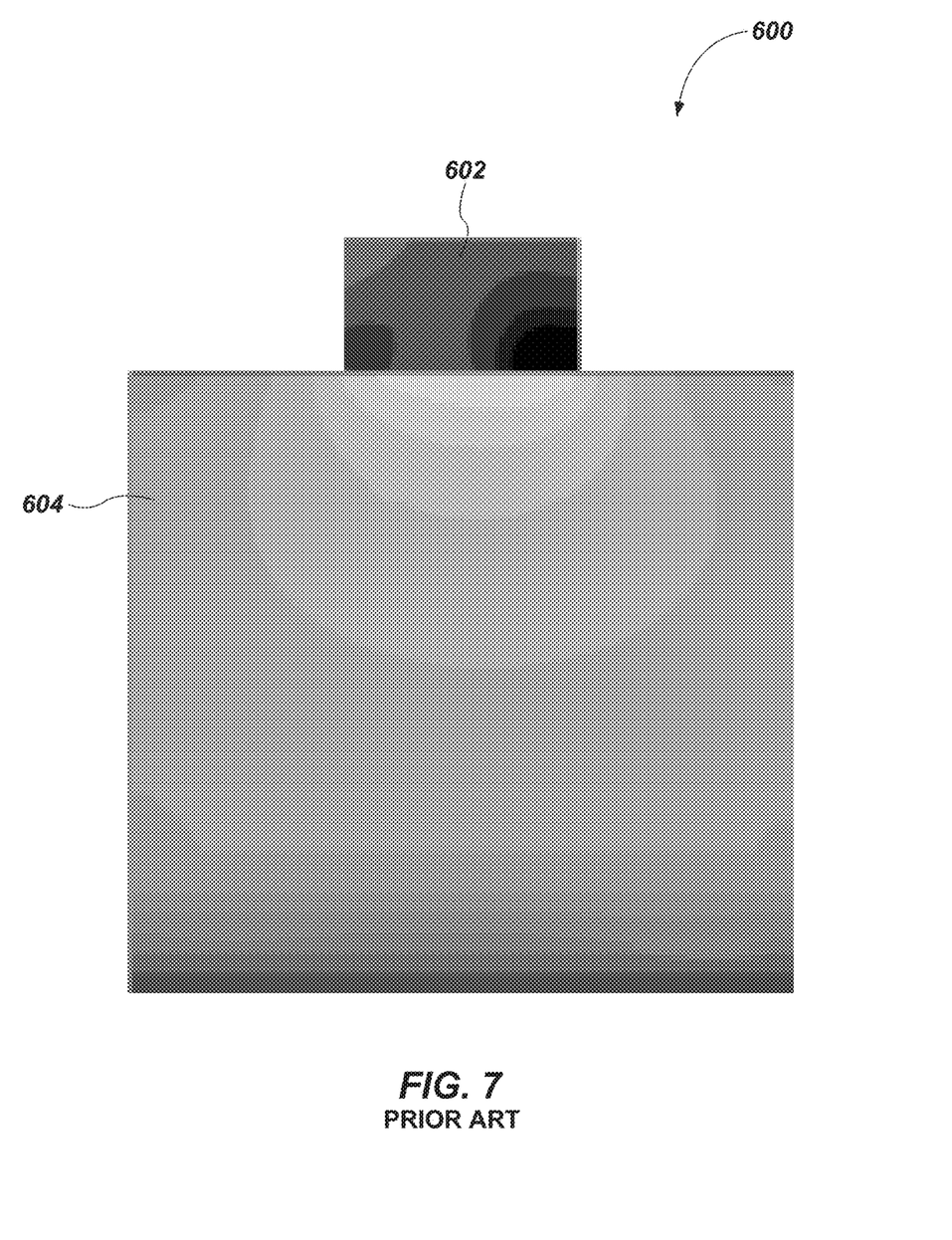
FIG. 7 is a side view thermal map illustrating heating of memory dice by the controller die.
Figure 8:
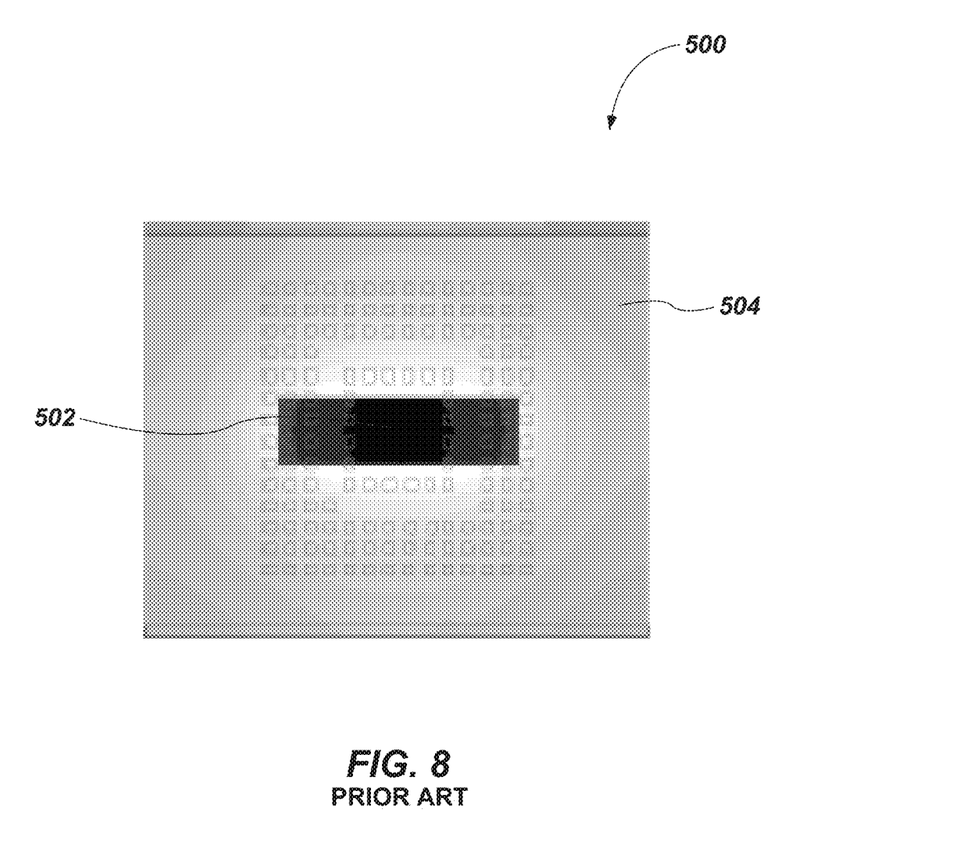
FIG. 8 is a top-down thermal map illustrating heating of memory dice by the controller die.

FIG. 7 is a side view thermal map illustrating heating of memory dice 604 by the controller die 602 in a side-by-side configuration, and FIG. 8 is a top-down thermal map illustrating heating of memory dice 504 by the controller die 502 in a controller-on-top configuration. With collective reference to FIGS. 7 and 8, heat generated by the comparatively higher power density controller die 502 or 602 may transfer through conduction to the memory dice 504 or 604. As a result, the junction temperatures of each of the controller die 502 or 602 and the memory dice 504 or 604 may be increased, particularly in those portions of the controller die 502 or 602 and the memory dice 504 or 604 that a proximate to one another (e.g., located a shortest distance from one another).

Such arrangements place a high power density die, such as a controller die, either immediately under a stack of memory dice or immediately laterally adjacent a stack of memory dice. In addition, either the height or the footprint of such conventional device and package designs may be undesirably large.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular semiconductor device, semiconductor device package, or component thereof, but are merely idealized representations employed to describe illustrative embodiments. Thus, the drawings are not necessarily to scale.

Disclosed embodiments relate generally to may better manage heat generated by semiconductor dice, may reduce device and/or package size and particularly device and/or package height, and may improve device and/or package performance. More specifically, disclosed are embodiments of semiconductor devices and semiconductor device packages that may include lower heat-generating, first semiconductor dice on a side of a substrate opposite a higher heat-generating second semiconductor die, may at least partially surround the first semiconductor dice and the second semiconductor die in different protective materials, and may locate the second semiconductor die closer to conductive elements that connect the semiconductor device or semiconductor device package to other devices and structures.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

As used herein, terms of relative positioning, such as "lateral," "longitudinal," "upper," "lower," and the like, refer to the relative positioning as oriented on the drawing sheet, and are in no way limiting of orientation of an apparatus, or any portion thereof, unless it is apparent that a particular orientation of the apparatus is necessary or desirable for operation in view of gravitational forces. For example, when referring to elements illustrated in the figures, the terms "lateral," "longitudinal," "upper," and "lower" may refer to an orientation of elements of a semiconductor device package with a substrate of that package oriented horizontally and conductive elements for connecting the package to other devices and structures located at a bottom of the package.

Figure 1:
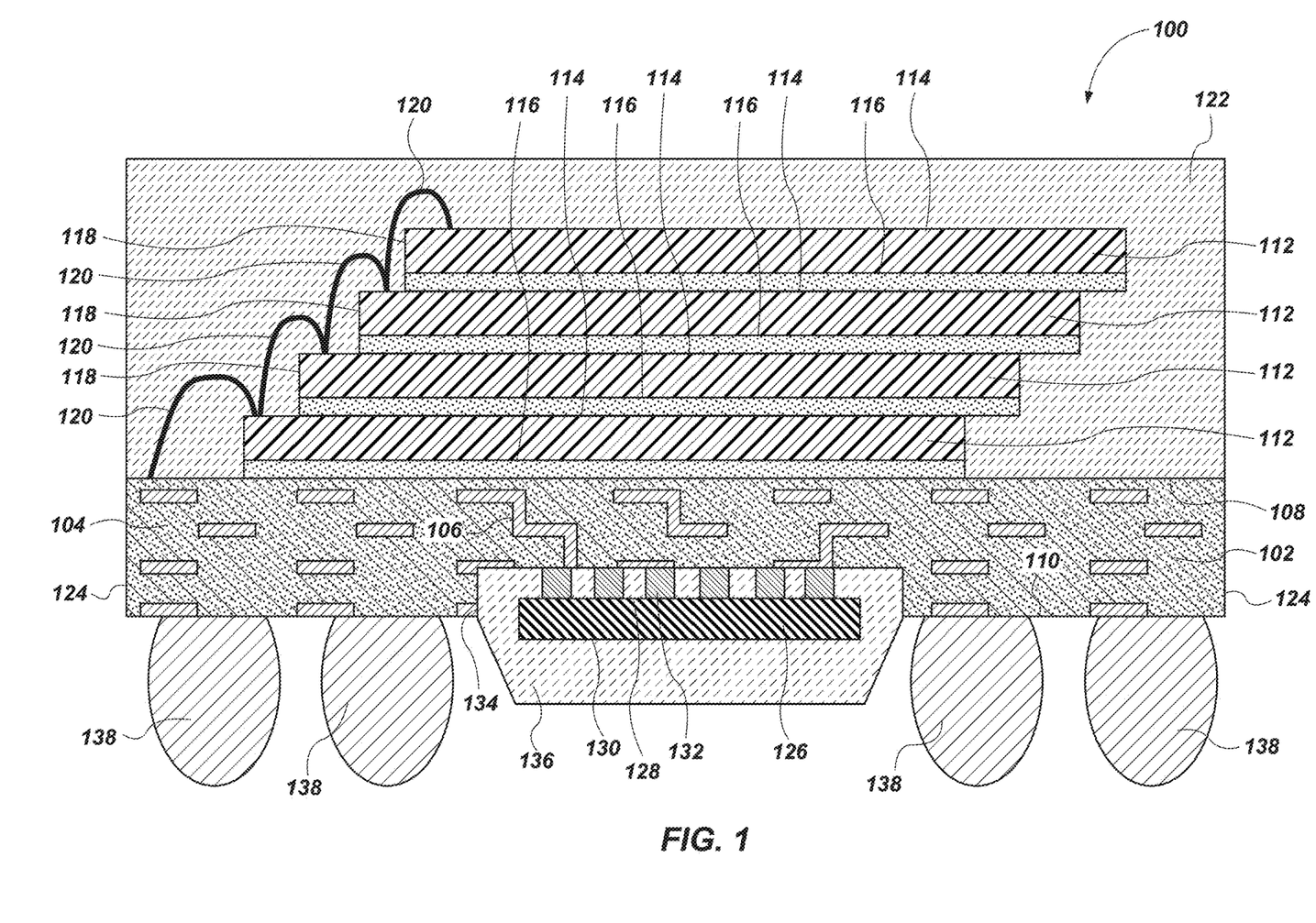
FIG. 1 is a cross-sectional schematic view of a first semiconductor device package 100 in accordance with this disclosure.

FIG. 1 is a cross-sectional schematic view of a first semiconductor device package 100 in accordance with this disclosure. The first semiconductor device package 100 may include, for example, a substrate 102 on which other components of the first semiconductor device package 100 may be supported. The substrate 102 may be configured as, for example, a printed circuit board or an interposer substrate and circuitry within the substrate core may function as a redistribution structure comprising one or more redistribution layers (RDLs) for routing data, power and bias (e.g., ground signals) internal to the package between the semiconductor dice and externally with higher level packaging.

The substrate 102 may include, for example, a dielectric material 104 and electrical interconnections 106 extending at least partially through the dielectric material 104. The dielectric material 104 may include, for example, an electrically and thermally insulating material, to electrically isolate at least some of the electrical interconnections 106 from one another, electrically isolate components supported on and affixed to the substrate 102 from one another, and inhibit flow of heat across the substrate 102. More specifically, the dielectric material 104 may include, for example, a glass-fiber reinforced polymer material having a thermal conductivity of about 1 W/m·K or less (e.g., between about 0.5 W/mK and about 0.75 W/mK). As a specific, nonlimiting example, the dielectric material 104 may include an epoxy polymer material.

The electrical interconnections 106 may provide an electrical pathway from a first major surface 108 on a first side of the substrate 102 to a second major surface 110 on a second, opposite side of the substrate 102. The electrical interconnections 106 may include, for example, traces, lines, vias, and/or other routing members of electrically conductive material, separated by layers of dielectric material 104. The electrically conductive material of the electrical interconnections 106 may include, for example, one or more of copper, gold, aluminum, and alloys including these materials.

A first semiconductor die 112 may be supported on the first side of the substrate 102, on or over the first major surface 108. In some embodiments, more than one first semiconductor die 112 may be supported on the first side of the substrate 102, such that a stack of first semiconductor dice 112 may be supported on the first side of the substrate 102. At least the bottom-most first semiconductor die 112 in the stack, adjacent to the substrate 102, may include, for example, a first active surface 114 located on a side of the first semiconductor die 112 opposite the substrate 102 and a first inactive surface 116 located on a side of the first semiconductor die 112 proximate to the substrate 102. More specifically, each first semiconductor die 112 in the stack may include a first active surface 114 located on a side of the first semiconductor die 112 opposite the substrate 102 and a first inactive surface 116 located on a side of the first semiconductor die 112 proximate to the substrate 102.

To facilitate such a configuration, each first semiconductor die 112 of the stack may be, for example, laterally offset with respect to a directly underlying first semiconductor die 112 of the stack. More specifically, at least a portion of an underlying first semiconductor die 112 at a lateral periphery of the first active surface 114 thereof may extend laterally beyond a lateral side surface 118 of an overlying first semiconductor die 112, forming a stair-step shape, which may also be termed a shingle stack. Bond pads on those portions of the first active surface 114 along a peripheral edge of each semiconductor die 112 are exposed laterally beyond an immediately overlying first semiconductor die 112 may likewise be exposed to provide terminals for electrical connections.

Wire bonds 120 may extend from each first semiconductor die 112 of the stack to the directly underlying first semiconductor die 112 of the stack or to the substrate 102. For example, a wire bond 120 may extend from a bond pad exposed at a lateral periphery of the bottom-most first semiconductor die 112 of the stack to an exposed contact in the form of a terminal pad of electrical interconnections 106 at the first major surface 108 of the substrate 102, and wire bonds 120 may extend from bond pads exposed at lateral peripheries of each overlying first semiconductor die 112, laterally beyond the lateral side surface 118 of the overlying first semiconductor die 112, and longitudinally downward to a bond pad exposed at the lateral periphery of the directly underlying first semiconductor die 112, generally following the stair-step configuration of the first semiconductor dice 112 of the stack. Such a configuration may maintain the length of each wire bond 120 generally short, reducing the risk of shorting adjacent wire bonds 120 to one another or of severing or dislodging a given wire bond 120 during encapsulation. In other embodiments, the wire bonds 120 of each first semiconductor die 112 may extend directly from the bond pads of that first semiconductor die 112 to the substrate 102. The wire bonds 120 may be located on, and connected to, the first semiconductor dice 112 of the stack only one lateral side of the stack of first semiconductor dice 112 in some embodiments. In other embodiments, wire bonds 120 may be located on, and connected to, one or more first semiconductor dice 112 of the stack on multiple lateral sides, assuming that the sizes and relative placement of the first semiconductor dice 112 expose bond pads on the first active surface 114 for connection to the wire bonds 120 on more than one lateral side.

Figure 2:
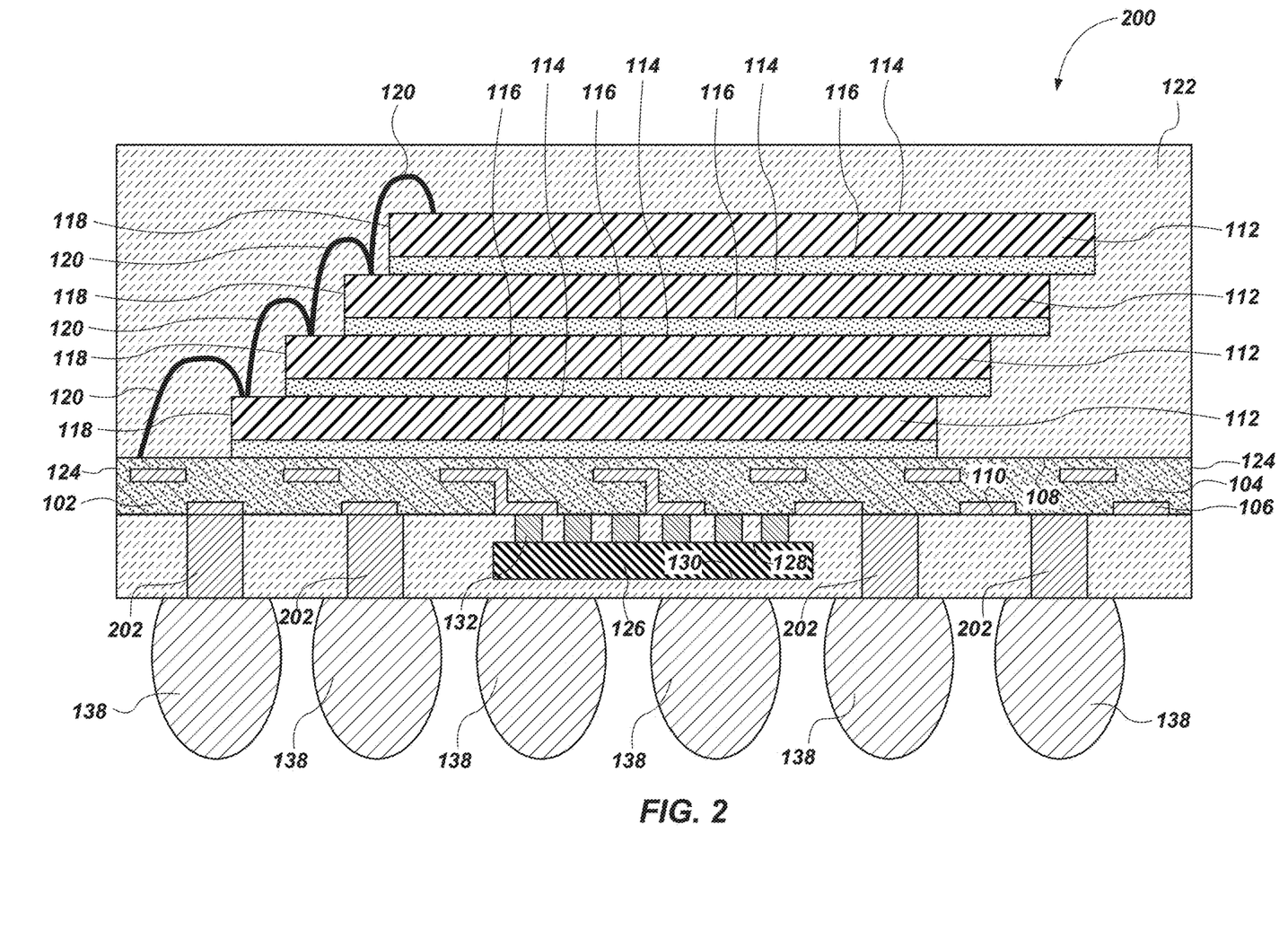
FIG. 2 is a cross-sectional schematic view of a second semiconductor device package 200 in accordance with this disclosure.

In other embodiments, different techniques may be employed to expose bond pads on first active surfaces 114 of first semiconductor dice 112 and/or otherwise connect the first semiconductor dice 112 in the stack to one another and/or to the substrate 102. For example, different first semiconductor dice 112 in the stack may have different lateral footprints from one another, and the differences in size between first semiconductor dice 112 may enable bond pads on first active surfaces 114 at lateral peripheries to be laterally exposed relative to overlying first semiconductor dice 112 (e.g., in a stepped pyramid shape). As another example, the wire bonds 120 may be omitted, and the first semiconductor dice 112 in the stack may be connected to one another and/or to the substrate 102 utilizing through-silicon vias, which may reduce (e.g., eliminate) the need to expose bond pads on the first active surfaces 114 of the first semiconductor dice 112. More specifically, one or more of the first semiconductor dice 112 may be in a flip-chip orientation, having the first active surface 114 oriented facing the substrate 102 and connected to the directly underlying component (e.g., the substrate 102 or another first semiconductor die 112) utilizing electrically conductive material (e.g., bumps, balls, pillars, or other shapes of solder material). Flip-chip orientation may be particularly employed for the bottom-most first semiconductor die 112 in the stack, such that the first semiconductor die 112 located adjacent to, and directly electrically and mechanically connected to, the substrate 102 may be in a flip-chip orientation, with other first semiconductor dice 112 in the stack also in a flip-chip orientation (utilizing vias) or oriented as generally shown in FIGS. 1 and 2. In embodiments employing through-silicon vias, the first semiconductor dice 112 may have the same lateral footprints and may be at least substantially laterally aligned with one another, such that the first active surfaces 114 of all the first semiconductor dice 112 other than the top-most first semiconductor die 112 farthest from the substrate 102 may be at least substantially concealed under, and laterally aligned with, the first inactive surface 116 of the immediately overlying first semiconductor die 112. In still other embodiments, additional semiconductor dice (e.g., having the same or a different operational configuration from the first semiconductor die 112) may be supported on the substrate 102, such as, for example, in a side-by-side configuration with the first semiconductor die 112 or stack of first semiconductor dice 112.

The first active surface 114 of each first semiconductor die 112 may include integrated circuitry embedded therein or positioned thereon, and the first inactive surface 116 of each first semiconductor die 112 may lack such integrated circuitry. The integrated circuitry of each first semiconductor die 112 may operationally configure the respective first semiconductor die 112 to perform a task or tasks. For example, the integrated circuitry of each first semiconductor die 112 may operationally configure the respective first semiconductor die 112 to operate as a memory device. More specifically, the integrated circuitry of each first semiconductor die 112 may operationally configure the respective first semiconductor die 112 to operate as FLASH memory configured as a not-and (NAND), dynamic random access memory (DRAM), not-or (NOR), or 3D XPoint memory device. As a specific, nonlimiting example, the integrated circuitry of each first semiconductor die 112 may operationally configure the respective first semiconductor die 112 to operate as memory within a managed NAND (mNAND), embedded multimedia card (eMMC), or embedded multi chip package (eMCP) memory package. As used herein, the terms "memory" and "memory device" shall be construed to exclude transitory signals. In some embodiments, each first semiconductor die 112 may be at least substantially identical to each other first semiconductor die 112, with additional first semiconductor dice 112 increasing capacity and bandwidth. In other embodiments, one or more first semiconductor dice 112 may be different from one or more other first semiconductor dice 112, with additional first semiconductor dice 112 having different operational configurations expanding functionality.

An encapsulant material 122 in the form of a dielectric molding compound may at least partially encapsulate the stack of first semiconductor dice 112 and the wire bonds 120 on the first side of the substrate 102. For example, the encapsulant material 122 may at least substantially laterally cover the first major surface 108 of the substrate 102, and may extend longitudinally from the first major surface 108 to at least the level of the first active surface 114 of the uppermost first semiconductor die 112 in the stack, and optionally above the highest level of the wire bond 120 connected to the uppermost first semiconductor die 112 in the stack above the first major surface 108. More specifically, the encapsulant material 122 may be laterally flush with lateral side surfaces 124 of the substrate 102 and may completely cover what would otherwise be exposed portions of the first major surface 108 of the substrate 102, the wire bonds 120, and the first active surfaces 114 and lateral side surfaces 118 of the first semiconductor dice 112 of the stack. The encapsulant material 122 may include, for example, a dielectric, polymer material. More specifically, the encapsulant material 122 may include a molding compound having higher thermal conductivity than the dielectric material 104 of the substrate 102, such as an epoxy resin material. As a specific, nonlimiting example, the encapsulant material 122 may include an epoxy resin material having a thermal conductivity of about 1.0 W/mK or more (e.g., between about 1 W/mK and about 7 W/mK).

A second semiconductor die 126 may be supported on a second, opposite side of the substrate 102. The second semiconductor die 126 may include a second active surface 128 located on a side of the second semiconductor die 126 facing the substrate 102 and a second inactive surface 130 located on a side of the second semiconductor die 126 opposite the first semiconductor dice 112. For example, conductive elements 132 may extend from bond pads on the second active surface 128 of the second semiconductor die 126 to aligned contacts of the electrical interconnections 106 of the substrate 102 with the second active surface 128 of the second semiconductor die 126 located proximate to, and facing, the substrate 102. More specifically, the second semiconductor die 126 may be connected, and directly affixed, to the substrate 102 in a flip-chip orientation and/or utilizing direct-chip-attach techniques via the conductive elements 132. The conductive elements 132 may include, for example, solder bumps, copper pillars, solder-capped copper pillars, or other structures of selectively flowable diffusible electrically conductive material. Such techniques may reduce the length of the electrical path from the second semiconductor die 126 to an output of the first semiconductor device package 100, which may improve the speed at which the first semiconductor device package 100 may be capable of operating as well as improve signal quality/fidelity.

The second active surface 128 of the second semiconductor die 126 may include integrated circuitry embedded therein or positioned thereon, and the second inactive surface 130 of the second semiconductor die 126 may lack such integrated circuitry. The integrated circuitry of the second semiconductor die 126 may operationally configure the second semiconductor die 126 to perform a task or tasks relating to operation, control and signal routing for first semiconductor dice 112. For example, the integrated circuitry of the second semiconductor die 126 may operationally configure the second semiconductor die 126 to operate as one or more of logic, a controller, a logic controller, or a microcontroller for a memory device. More specifically, the integrated circuitry of the second semiconductor die 126 may operationally configure the second semiconductor die 126 to operate as a controller for any of the memory devices and memory packages discussed previously.

In some embodiments, the second semiconductor die 126 may be configured with circuitry operating at a relatively higher power density than first semiconductor dice 112, which configuration may generate substantially more heat than the first semiconductor dice 112 during operation. For example, the second semiconductor die 126 may have a higher power rating than a power rating of each one of the first semiconductor die 112 in the stack. More specifically, the integrated circuitry at the second active surface 128 of the second semiconductor die 126 may typically draw (e.g., may require for operation) more electrical power than the electrical power typically drawn (e.g., required for operation of) the integrated circuitry at the first active surface 114 of any one of the first semiconductor dice 112 (e.g., the second semiconductor die 126 may be configured to have a higher mean and/or median power consumption than one or more of the first semiconductor dice 112). As specific, nonlimiting examples, the second semiconductor die 126 may have a higher power rating and/or a higher power density than the power ratings and/or power densities of all the first semiconductor dice 112 in the stack combined (e.g., the second semiconductor die 126 may account for at least half of the mean and/or median total power consumption of the first semiconductor device package 100). In embodiments where the heat generated during operation by each of the first semiconductor dice 112 is different from the heat generated by the second semiconductor die 126, the substrate 102 may inhibit the flow of heat between the second semiconductor die 126 and the first semiconductor dice 112, which may reduce the extent to which heat generated by the second semiconductor die 126 is conducted to, and raises the temperature of, the first semiconductor dice 112. As a result, heat may flow more directly from each of the first semiconductor die 112 and the second semiconductor die 126 toward the exterior of the first semiconductor device package 100, the junction temperatures of the first semiconductor die 112 and the second semiconductor die 126 may be more likely to remain within recommended limits, and the need to throttle performance of the semiconductor die package to remain within recommended operating temperatures may be reduced (e.g., eliminated).

In some embodiments, the second semiconductor die 126 is located at least partially within a recess 134 extending into the substrate 102 from the second side. For example, the recess 134 may extend from the second major surface 110 of the substrate 102 on the second side of the substrate 102, into the substrate 102 toward the first side and toward the first major surface 108. More specifically, the recess 134 may have a geometrical shape generally matching the shape of the second semiconductor die 126 to be at least partially located therein and may be larger than the second semiconductor die 126 to facilitate positioning the second semiconductor die 126 at least partially therein. Still more specifically, the recess 134 may be shaped as, for example, a right polygonal prism having lateral dimensions larger than the corresponding lateral dimensions of the second semiconductor die 126 and a depth, as measured in a direction perpendicular to the first major surface 108 and/or the second major surface 110, less than, equal to, or greater than the corresponding depth of the second semiconductor die 126 and the conductive elements 132 collectively located partially or completely within the recess 134. As a specific, nonlimiting example, the recess 134 may be shaped as a right rectangular prism having lateral dimensions between about 101% and about 125% of the corresponding lateral dimensions of the second semiconductor die 126 and a depth less than (e.g., between about 50% and about 90% of) the combined depths of the second semiconductor die 126 and the conductive elements 132 located at least partially within the recess 134. Thus, recess 134 by accommodating at least a portion of a combined thickness of second semiconductor device and height of conductive elements 132 may allow for a smaller package height and footprint than heights and footprints of conventional semiconductor packages having equivalent functionality.

In some embodiments, a first lateral footprint of the first semiconductor die 112 may be greater than a second lateral footprint of the second semiconductor die 126. For example, at least one lateral dimension of the first semiconductor die 112, as measured in a direction parallel to the first major surface 108 and/or the second major surface 110 of the substrate 102, may be greater than a corresponding lateral dimension of the second semiconductor die 126, as measured in the same direction. More specifically, a first surface area of the first active surface 114 of each first semiconductor die 112 may be greater than a second surface area of the second active surface 128 of the second semiconductor die 126. As a specific, nonlimiting example, each lateral dimension of the first semiconductor die 112 may be greater than the corresponding lateral dimension of the second semiconductor die 126. In other embodiments, the first lateral footprint of the first semiconductor die 112 may be less than the second lateral footprint of the second semiconductor die 126.

The first semiconductor device package 100 may include another encapsulant material 136 at least partially filling the recess 134 and at least partially surrounding the second semiconductor die 126. For example, the other encapsulant material 136 may at least completely fill the recess 134, such that the other encapsulant material 136 may extend to a location longitudinally at least flush with the second major surface 110 and laterally at least to flush with sidewalls of the recess 134. More specifically, the other encapsulant material 136 may at least completely laterally surround the second semiconductor die 126, such that the other encapsulant material 136 may extend to a location longitudinally at least flush with the second inactive surface 130 and laterally beyond the second semiconductor die 126 on each lateral side. As a specific, nonlimiting example, the other encapsulant material 136 may completely fill the recess 134 and completely surround the second semiconductor die 126, extending longitudinally from within the recess 134 to a location beyond the second inactive surface 130 on a side of the second semiconductor die 126 opposite the substrate 102, extending laterally within the lateral confines of the recess 134, and leaving the second major surface 110 of the substrate 102 surrounding the recess 134 at least substantially free of the other encapsulant material 136.

The other encapsulant material 136 at least partially surrounding the second semiconductor die 126 may include, for example, a dielectric polymer material different from the encapsulant material 122 at least partially surrounding the first semiconductor die 112. More specifically, the other encapsulant material 136 may include a molded underfill material or other molding compound having higher thermal conductivity than the dielectric material 104 of the substrate 102, such as an epoxy resin material. As a specific, nonlimiting example, the other encapsulant material 136 may include a molded underfill material having a thermal conductivity of about 1.0 W/mK or more (e.g., between about 1 W/mK and about 7 W/mK). In some embodiments, the thermal conductivity of the other encapsulant material 136 at least partially surrounding the second semiconductor die 126 may be equal to or greater than the thermal conductivity of the encapsulant material 122 surrounding the first semiconductor die 112. In other embodiments, the thermal conductivity of the other encapsulant material 136 at least partially surrounding the second semiconductor die 126 may be less than the thermal conductivity of the encapsulant material 122 surrounding the first semiconductor dice 112.

Placing the first semiconductor die 112 and the second semiconductor die 126 on opposite sides of the substrate 102, at least partially surrounding the first semiconductor die 112 in an encapsulant material 122 having a higher thermal conductivity than the substrate 102 (or at least the dielectric material 104 thereof), and at least partially surrounding the second semiconductor die 126 in another encapsulant material 136 having a higher thermal conductivity than the substrate 102 may better manage flow of heat from the first semiconductor die 112 and the second semiconductor die 126. For example, such a configuration may direct a path of least resistance for heat generated by the first semiconductor die 112 away from the substrate 102 and away from the second semiconductor die 126 and may direct a path of least resistance for heat generated by the second semiconductor die 126 away from the substrate 102 and away from the first semiconductor die 112. In embodiments where the second semiconductor die 126 is configured to generate more heat than the first semiconductor die 112, and where the other encapsulant material 136 has a higher thermal conductivity than the encapsulant material 122, the configuration of the first semiconductor device package 100 may also better facilitate exchange of heat from the highest heat-generating component of the first semiconductor device package 100 (i.e., the second semiconductor die 126) away from the first semiconductor device package 100 and to the operating environment.

The first semiconductor device package 100 may include conductive elements 138 supported on, and extending directly from, conductive pads on the second major surface 110 of the substrate 102. For example, the conductive elements 138 may extend from contacts of the electrical interconnections 106 of the substrate 102 at the second major surface 110 longitudinally away from the first semiconductor die 112. More specifically, the conductive elements 138 may extend from associated electrical interconnections 106 at the second major surface 110, and from longitudinally coincident with at least a portion of the second semiconductor die 126, longitudinally away from the first semiconductor die 112, to a location at least longitudinally flush with a portion of the other encapsulant material 136 most distant from the second major surface 110. As a specific, nonlimiting example, the conductive elements 138 may extend from the second major surface 110 to a location longitudinally beyond the other encapsulant material 136, such that a surface or point of the other encapsulant material 136 most distant from the second major surface 110 may be located longitudinally between about 25% and about 75% (e.g., about 50%) of the depth of the conductive elements 138, as measured in a direction perpendicular to the second major surface 110. The conductive elements 138 may include, for example, bumps, pads, pillars, or other structures of selectively flowable electrically conductive material (e.g., solder). In one embodiment, conductive elements 138 comprise solder balls residing on conductive pads configured as under-bump metallization (UBM) or bond pads.

In summary, semiconductor devices and semiconductor device packages in accordance with certain embodiments of this disclosure may include a first semiconductor die supported on a first side of a substrate. The first semiconductor die may include a first active surface. A second semiconductor die may be supported on a second, opposite side of the substrate. The second semiconductor die may include a second active surface located on a side of the second semiconductor die facing the substrate. The second semiconductor die may be configured to have higher median power consumption than the first semiconductor die during operation.

Semiconductor device packages in accordance with other embodiments of this disclosure may include a stack of first semiconductor dice supported on a first side of a substrate, each first semiconductor die of the stack comprising a first active surface. Wire bonds may extend from each first semiconductor die of the stack to the directly underlying first semiconductor die of the stack or to the substrate. A second semiconductor die may be supported on a second, opposite side of the substrate, the second semiconductor die comprising a second active surface located on a side of the second semiconductor die facing the substrate. An encapsulant material may at least partially encapsulate the stack of first semiconductor dice and the wire bonds on the first side of the substrate. A molded underfill material different from the encapsulant material may at least partially surround the second semiconductor die on the second side of the substrate.

FIG. 2 is a cross-sectional view of a second semiconductor device package 200 in accordance with this disclosure. The second semiconductor device package 200 may be at least similar to the first semiconductor device package 100, with notable differences highlighted below.

In the second semiconductor device package 200, the second semiconductor die 126 may not be located within a recess 134 (see FIG. 1). For example, the second semiconductor die 126 may be located directly adjacent to the second major surface 110 of the substrate 102 on the second side of the substrate 102. More specifically, the conductive elements 132 may extend from bond pads on the second active surface 128 of the second semiconductor die 126 to contacts in the form of terminal pads of the electrical interconnections 106 exposed at the second major surface 110 of the substrate 102 with the second active surface 128 of the second semiconductor die 126 located proximate to, and facing, the substrate 102. As a specific, nonlimiting example, the second semiconductor die 126 may be connected, and directly affixed, to the second major surface 110 the substrate 102 in a flip-chip orientation and/or utilizing direct-chip-attach techniques via the conductive elements 132.

The substrate 102 may lack any recesses 134 (see FIG. 1) that would interrupt the planarity of the first major surface 108 and the second major surface 110 and, unlike substrate 102 of first semiconductor device package 100, substrate 102 of second semiconductor package 200 comprises only a redistribution structure configured in a fan out package (FOP) arrangement comprising one or more RDLs, each RDL comprising a conductive material 106 supported on a dielectric material 104, the conductive material comprising traces and other conductive elements extending beyond lateral boundaries of the lowermost first semiconductor die 112. Consequently, substrate 102 of semiconductor device package 200 may be substantially thinner than substrate 102 of first semiconductor device package 100. Such a configuration may reduce the length of the electrical path from the second semiconductor die 126 to an output of the first semiconductor device package 100, which may improve the speed at which the first semiconductor device package 100 may be capable of operating as well as improve signal quality/fidelity, in comparison to conventional semiconductor device packages having equivalent functionality. Furthermore, package height and footprint may be reduced, in comparison to such conventional packages.

The other encapsulant material 136 at least partially surrounding the second semiconductor die 126 may not be located within a recess 134 (see FIG. 1) and may extend laterally beyond the location of the lateral confines of such a recess 134 (see FIG. 1). For example, the other encapsulant material 136 may cover at least a portion of the second major surface 110 of the substrate 102. More specifically, the other encapsulant material 136 may be located directly on, and be in contact with, the second major surface 110 of the substrate 102, and may at least laterally surround the second semiconductor die 126. As a specific, nonlimiting example, the other encapsulant material 136 may extend longitudinally from the second major surface 110 to a location farther from the second major surface 110 than the second inactive surface 130 of the second semiconductor die 126 and laterally to at least substantially flush with the lateral side surfaces 124 of the substrate 102.

The conductive elements 138 may not be located directly on the second major surface 110, but may be longitudinally spaced from the second major surface 110. For example, the second semiconductor device package 200 may include conductive vias 202 extending from contacts of the electrical interconnections 106 at the second major surface 110, through the other encapsulant material 136, to the conductive elements 138 protruding from a side of the other encapsulant material 136 opposite the substrate 102. The vias 202 may include, for example, pillars, posts, cylinders, or other structures of electrically conductive material extending longitudinally through the other encapsulant material 136, and may be characterized as "through-mold-vias." In one embodiment, conductive elements 138 may comprise solder balls residing on conductive pads configured as under bump metallization (UBM) or bond pads.

Figure 3:
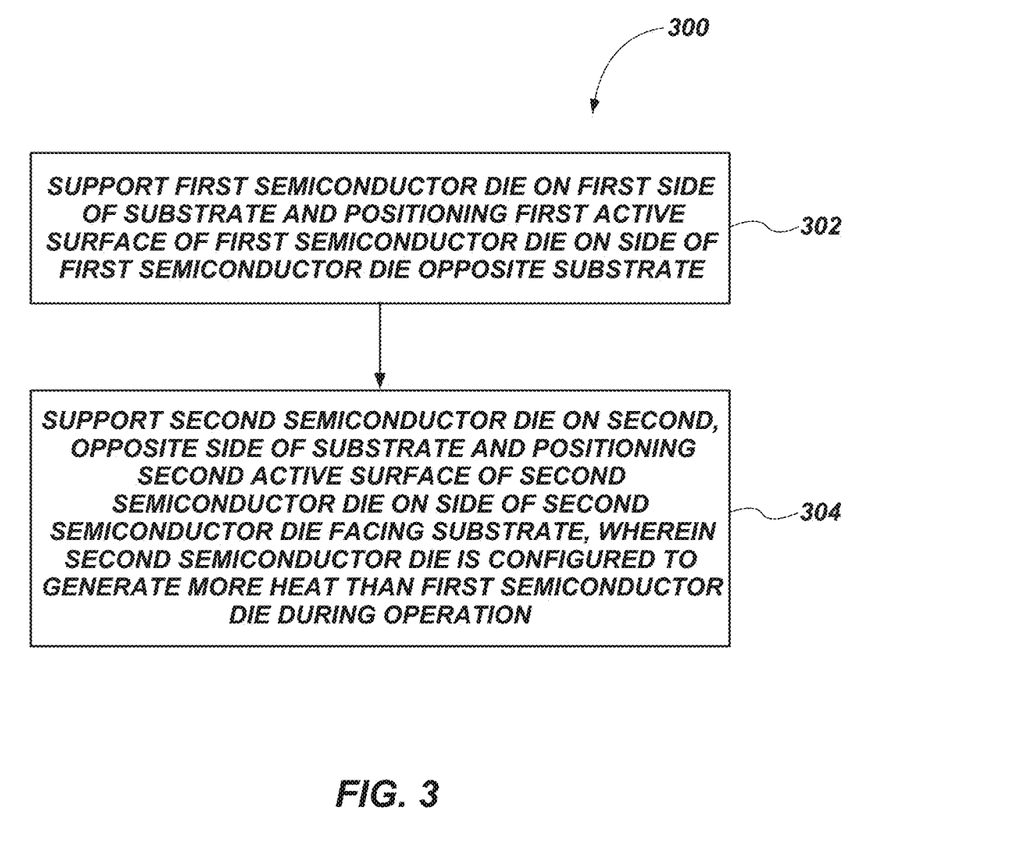
FIG. 3 is a flowchart depicting a method of making a semiconductor device package in accordance with this disclosure.

FIG. 3 is a flowchart depicting a method 300 of making a semiconductor device package 100 and/or 200 in accordance with this disclosure. With combined reference to FIGS. 1 through 3, a first semiconductor die 112 may be supported on a first side of a substrate 102, and a first active surface 114 of the first semiconductor die 112 may be positioned on a side of the first semiconductor die 112 opposite the substrate 102, as shown at act 302. In some embodiments, multiple first semiconductor dice 112 may be provided in a stack with their first active surfaces 114 oriented in the same direction, and may be affixed to one another and to the substrate 102 by, for example, thermo-compression bonding. The wire bonds 120 extending from the bond pads at first active surfaces 114 of a respective first semiconductor die 112 may be formed to extend from those bond pads to bond pads of a directly underlying first semiconductor die 112 or to contacts of the electrical interconnections 106 of the substrate 102, which may be accomplished utilizing conventional wire bonding techniques. The encapsulant material 122 may be positioned around the lateral side surfaces 118 of and over at least portions (e.g., entireties of exposed portions) of the first active surfaces 114 of the first semiconductor dice 112 and over the first major surface 108 of the substrate 102 located laterally beyond the lateral side surfaces 118 of the first semiconductor die 112 (e.g., on all lateral sides) to flush with the lateral side surfaces 124 of the substrate 102. For example, the substrate 102 with the first semiconductor dice 112 and wire bonds 120 supported thereon may be introduced into a mold, and a precursor of the encapsulant material 122 in a flowable state may be flowed into the aforementioned positions within the mold. The precursor material may then be cured to form the encapsulant material 122.

A second semiconductor die 126 may be supported on a second, opposite side of the substrate 102, and a second active surface 128 of the second semiconductor die 126 may be placed on a side of the second semiconductor die 126 facing the substrate 102, as shown at act 304 of the method 300. For example, the second semiconductor die 126 may be placed at least partially within a recess 134 extending from the second major surface 110 of the substrate 102 on the second side of the substrate 102, into the substrate 102 toward the first side, as shown in FIG. 1. As another example, the second semiconductor die 126 may be placed directly adjacent to the second major surface 110 on the second side of the substrate 102, as shown in FIG. 2.

The second semiconductor die 126 may be configured to generate more heat than the first semiconductor die 112 or first semiconductor dice 112 during operation. For example, when selecting the semiconductor dice that will be positioned on the opposite sides of the substrate 102, the first semiconductor dice 112 may be selected to operate as memory devices, whereas the second semiconductor die 126 may be selected to operate as a memory controller device.

Another encapsulant material 136 may be positioned at least partially surrounding the second semiconductor die 126 on the second, opposite side of the substrate 102. In embodiments where the second semiconductor die 126 is at least partially located within a recess 134, for example, the other encapsulant material 136 may at least partially fill the recess 134 and at least partially surround the second semiconductor die 126. In embodiments where the second semiconductor die 126 is located directly adjacent, and is affixed directly, to the second major surface 110 of the second semiconductor die 126, the other encapsulant material 136 may at least partially surround the second semiconductor die 126, may cover at least a portion of the second major surface 110, and may be in direct contact with the second major surface 110. Placement of the other encapsulant material 136 may take place utilizing processes similar, or at least substantially identical, to those described in connection with the encapsulant material 122.

The conductive elements 138 may then be placed in electrical communication with the first semiconductor dice 112 and the second semiconductor die 126. For example, in those embodiments where the second semiconductor die 126 is located at least partially within the recess 134, the conductive elements 138 may be placed directly on, and affixed to, contacts of the electrical interconnections 106 exposed at the second major surface 110 of the substrate 102. As another example, in those embodiments where the second semiconductor die 126 is located directly on, and affixed directly to, the second major surface 110 of the substrate 102 (via its own conductive elements 132), vias 202 extending from the contacts of the electrical interconnections 106 at the second major surface 110, through the other encapsulant material 136, and to a longitudinal side of the other encapsulant material 136 opposite the substrate 102 may be formed. The conductive elements 138 may then be placed in direct contact with, and affixed to, the vias 202. The conductive vias 202 may be formed by, for example, removing portions of the other encapsulant material 136 overlying the contacts of the electrical interconnections 106 and filling the remaining voids with electrically conductive material. As another example, the vias 202 may be formed by placing posts, pillars, columns, or other structures of electrically conductive material on the contacts of the electrical interconnections 106 at the second major surface 110, and the other encapsulant material 136 may be flowed and cured laterally around the vias 202. The vias 202 may be longitudinally exposed by planarizing the other encapsulant material 136 and the electrically conductive material of the vias or by controlling the depth of placement of the other encapsulant material 136.

In other words, methods of making semiconductor devices and semiconductor device packages in accordance with certain embodiments of this disclosure may involve supporting a first semiconductor die comprising a first active surface on a first side of a substrate. A second semiconductor die may be supported on a second, opposite side of the substrate and a second active surface of the second semiconductor die may be positioned on a side of the second semiconductor die facing the substrate. The second semiconductor die may be configured to have higher median power consumption than the first semiconductor die during operation.

Figure 4:
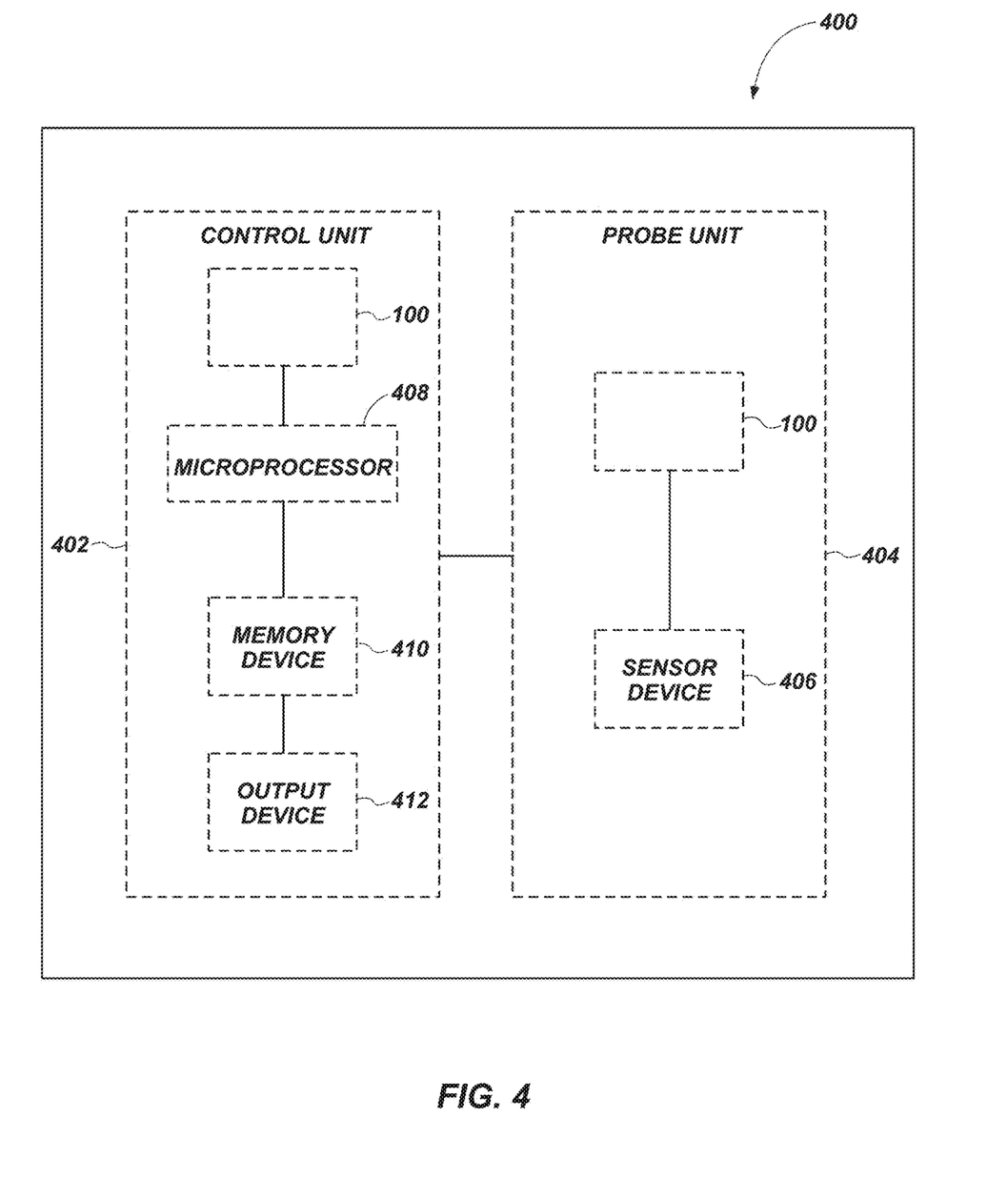
FIG. 4 is a schematic diagram of an electronic system incorporating a semiconductor device package according to an embodiment of the disclosure.

FIG. 4 is a schematic diagram of an electronic system 400 including the semiconductor device package 100 or 200 of FIG. 1 or FIG. 2. For example, the electronic system 400 may include a control unit 402 and a probe unit 404. The probe unit 404 may include a sensor device 406 configured to generate an electrical signal representative of, and in response to, a detected physical phenomenon. The probe unit 404 may be a portable device, such as, for example, a handheld device. In some embodiments, the probe unit 404 may include a semiconductor device package 100 or 200 (see FIGS. 1, 2) in accordance with this disclosure located within the probe unit 404, the semiconductor device package 100 or 200 configured to at least partially process or store the electrical signal locally within the probe unit 404. The probe unit 404 may be operatively connected to the control unit 402 (e.g., over a wired or wireless connection) and may send the raw, partially processed, or fully processed electrical signal to the control unit 402. In some embodiments, the control unit 402 may include another semiconductor device package 100 or 200 (see FIGS. 1, 2) in accordance with this disclosure or a microprocessor 408, which may store, process, or further process the electrical signal. The control unit 404 may include a memory device 410 (i.e., a physical, hardware memory device that is not a transitory signal) configured to store the results of the fully processed electrical signal, which may also be configured as or include a semiconductor device package 100 or 200 (see FIGS. 1, 2) in accordance with this disclosure. The control unit 402 may optionally include an output device 412 (e.g., an electronic display, an audio speaker, a printer, etc.) configured to output the results of the fully processed electrical signal.

In summary, electronic systems in accordance with this disclosure may include, for example, a probe unit and a control unit. At least one of the probe unit and the control unit may include a semiconductor device or semiconductor device package configured to at least partially process or store an electrical signal generated by the probe unit. The semiconductor device or semiconductor device package may include at least one first semiconductor die comprising a first active surface supported on a first side of a substrate. A second semiconductor die may be supported on a second, opposite side of the substrate, the second semiconductor die comprising a second active surface located on a side of the second semiconductor die facing the substrate. The second semiconductor die may be configured to have higher median power consumption than the at least one first semiconductor die during operation.

Among other problems addressed by configurations and methods discussed previously in this application semiconductor devices and semiconductor device packages in accordance with this disclosure may better address problems relating to thermal management, operating speed, and signal quality. For example, by positioning semiconductor dice on opposite sides of a substrate interposed between the semiconductor dice, thermally insulating material of the substrate may redirect the path of least resistance for heat from the semiconductor dice away from one another and out of the semiconductor device or semiconductor device package. As another example, by shortening the length of the electrical pathway from at least one of the semiconductor dice, and potentially from all the semiconductor dice in the device or package, to the output conductive elements, the quality of the electrical signals carried by those electrical pathways and the speed at which they may travel may be improved.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A semiconductor device, comprising:
   at least one first semiconductor die supported on a first side of a substrate, the at least one first semiconductor die comprising a first active surface;
   a second semiconductor die supported on a second, opposite side of the substrate, the second semiconductor die comprising a second active surface located on a side of the second semiconductor die facing the substrate;
   wherein the second semiconductor die is configured to have higher median power consumption than the at least one first semiconductor die during operation and wherein the second semiconductor die is located at least partially within a recess extending into the substrate from the second side of the substrate toward the first side of the substrate; and
   conductive elements connected to the substrate on the second, opposite side, the conductive elements configured to connect the semiconductor device to higher-level packaging.

2. The semiconductor device of claim 1, further comprising a molded underfill material at least partially filling the recess and at least partially surrounding the second semiconductor die.

3. The semiconductor device of claim 2, wherein the molded underfill material is at least substantially laterally confined to the recess, such that the major surface of the substrate is at least substantially free of the molded underfill material.

4. The semiconductor device of claim 1, wherein the conductive elements are supported on, and extend directly from, the major surface of the substrate.

5. The semiconductor device of claim 1, wherein the at least one first semiconductor die comprises a memory device and wherein the second semiconductor die comprises a memory controller device.

6. The semiconductor device of claim 1, wherein the at least one first semiconductor die comprises a stack of first semiconductor dice supported on the first side of the substrate, each first semiconductor die comprising a first active surface located on the side of the respective first semiconductor die opposite the substrate.

7. The semiconductor device of claim 6, wherein first semiconductor dice of the stack of first semiconductor dice are mutually laterally offset in a common direction from a next-lower first semiconductor die, and first semiconductor dice of the stack are electrically connected to one another and to the substrate by wire bonds.

8. The semiconductor device of claim 7, wherein the first semiconductor dice comprise memory dice and the second semiconductor die comprises a controller.

9. The semiconductor device of claim 1, wherein a first footprint of the at least one first semiconductor die when viewed in a plan view is greater than a second footprint of the second semiconductor die when viewed in the plan view.

10. A semiconductor device package, comprising:
a stack of first semiconductor dice supported on a first side of a substrate, each first semiconductor die of the stack comprising a first active surface;
wire bonds extending from each first semiconductor die of the stack to a directly underlying first semiconductor die of the stack or to the substrate;
a second semiconductor die supported on a second, opposite side of the substrate, the second semiconductor die comprising a second active surface located on a side of the second semiconductor die facing the substrate;
wherein the second semiconductor die is configured to have higher median power consumption than the at least one first semiconductor die during operation and wherein the second semiconductor die is located at least partially within a recess extending into the substrate from the second side of the substrate toward the first side of the substrate;
an encapsulant material at least partially encapsulating the stack of first semiconductor dice and the wire bonds on the first side of the substrate;
a molded underfill material different from the encapsulant material at least partially surrounding the second semiconductor die on the second side of the substrate; and
conductive elements connected to the substrate on the second, opposite side, the conductive elements configured to connect the semiconductor device to higher-level packaging.

11. The semiconductor device package of claim 10, wherein the wire bonds are connected to the first semiconductor dice of the stack only on one lateral side of the stack of first semiconductor dice.

12. The semiconductor device package of claim 10, wherein the second semiconductor die is electrically connected to the substrate in a direct chip attach configuration.

13. The semiconductor device package of claim 11, wherein the first semiconductor dice of the stack comprise NAND or DRAM memory devices and the second semiconductor die comprises a controller device.

14. A method of making a semiconductor device, comprising:
supporting a first semiconductor die comprising a first active surface on a first side of a substrate;
supporting a second semiconductor die configured to have higher median power consumption than the first semiconductor die during operation on a second, opposite side of the substrate by placing the second semiconductor die at least partially within a recess extending into the substrate from the second side of the substrate toward the first side of the substrate and positioning a second active surface of the second semiconductor die on a side of the second semiconductor die facing the substrate; and
connecting conductive elements to the substrate on the second, opposite side, the conductive elements configured to connect the semiconductor device to higher-level packaging.

15. The method of claim 14, further comprising at least partially filling the recess with a molded underfill material and at least partially surrounding the second semiconductor die with the molded underfill material.

16. An electronic system, comprising:
a probe unit; and
a control unit;
at least one of the probe unit and the control unit comprising a semiconductor device configured to at least partially process or store an electrical signal generated by the probe unit, the semiconductor device comprising:
at least one first semiconductor die supported on a first side of a substrate, the at least one first semiconductor die comprising a first active surface;
a second semiconductor die supported on a second, opposite side of the substrate, the second semiconductor die comprising a second active surface located on a side of the second semiconductor die facing the substrate;
wherein the second semiconductor die is configured to have higher median power consumption than the at least one first semiconductor die during operation and wherein the second semiconductor die is located at least partially within a recess extending into the substrate from the second side of the substrate toward the first side of the substrate; and
conductive elements connected to the substrate on the second, opposite side, the conductive elements configured to connect the semiconductor device to higher-level packaging.

* * * * *